(12) United States Patent
Galbraith et al.

(10) Patent No.: US 9,106,045 B2
(45) Date of Patent: Aug. 11, 2015

(54) LASER ILLUMINATOR

(75) Inventors: Philip Galbraith, Malvern (GB); David Caradoc Jones, Malvern (GB)

(73) Assignee: QINETIQ LIMITED, Hampshire (GB)

( * ) Notice: Subject to any disclaimer, the term of this patent is extended or adjusted under 35 U.S.C. 154(b) by 4 days.

(21) Appl. No.: 13/395,295

(22) PCT Filed: Sep. 21, 2010

(86) PCT No.: PCT/GB2010/001759
§ 371 (c)(1),
(2), (4) Date: Mar. 9, 2012

(87) PCT Pub. No.: WO2011/039500
PCT Pub. Date: Apr. 7, 2011

(65) Prior Publication Data
US 2012/0176810 A1    Jul. 12, 2012

(30) Foreign Application Priority Data
Sep. 30, 2009 (GB) .................................. 0917132.3

(51) Int. Cl.
*F21V 7/04* (2006.01)
*G01S 1/00* (2006.01)
(Continued)

(52) U.S. Cl.
CPC ............... *H01S 3/005* (2013.01); *G02B 6/4296* (2013.01); *H01S 5/005* (2013.01)

(58) Field of Classification Search
CPC ............ G02B 6/32; G02B 6/26; G02B 6/262; G02B 6/264; G02B 6/0006; G02B 6/0008; G02B 27/40; G02B 27/48; G02B 27/62; G02B 6/4296; H01S 3/005; H01S 5/005
USPC ......... 362/553, 555, 558, 560, 259, 511, 538; 285/88
See application file for complete search history.

(56) References Cited

U.S. PATENT DOCUMENTS 3,772,506 A    11/1973  Junginger
4,453,806 A    6/1984   Wick
(Continued)

FOREIGN PATENT DOCUMENTS

FR    2 671 162 A1    7/1992

OTHER PUBLICATIONS

Hecht, Optics, 2002, Addison Wesley, Fourth Edition, pp. 197-200.*
(Continued)

*Primary Examiner* — Jason Moon Han
(74) *Attorney, Agent, or Firm* — Oliff PLC

(57) ABSTRACT

A long range laser illuminator is disclosed that is suitable for providing illumination for camera systems at ranges up to approximately 20 km. The illuminator incorporates a diverger that allows for a compact, low F-number optical arrangement that improves eye safety by reducing the power density across a primary optical element, such as a spherical or parabolic mirror. The diverger may be located at an end of an optical fiber feed, or between a pair of optical fibers. The diverger may incorporate a diffuser, such as a "top hat" diffuser. The optical fiber feeds may be highly multi mode, to provide for a more even illumination. The illuminator incorporates means for altering a focus of the output light beam, to allow an illuminated spot size to be altered. The illuminator is particularly suitable for use at night, where it may be used alongside a camera system.

15 Claims, 2 Drawing Sheets

Figure 1:
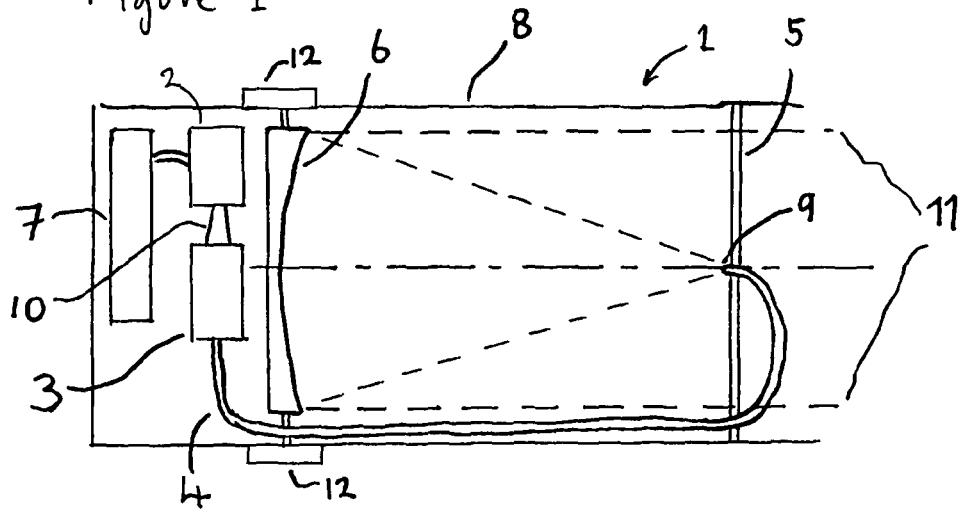

(51) Int. Cl.
*G09B 9/00* (2006.01)
*H01S 3/00* (2006.01)
*H01S 3/30* (2006.01)
*G02B 6/42* (2006.01)
*H01S 5/00* (2006.01)

(56) References Cited

U.S. PATENT DOCUMENTS

| | | | |
|---|---|---|---|
| 4,536,828 A | | 8/1985 | Mori |
| 4,628,416 A | * | 12/1986 | Dewey .......................... 362/553 |
| 5,309,282 A | * | 5/1994 | Feldman et al. ............... 359/641 |
| 5,438,485 A | * | 8/1995 | Li et al. ......................... 362/558 |
| 5,725,296 A | | 3/1998 | Bibbiani et al. |
| 5,997,163 A | | 12/1999 | Brown |
| 6,431,731 B1 | | 8/2002 | Krietzman |
| 6,672,739 B1 | * | 1/2004 | Argyle et al. ................. 362/259 |
| 2002/0172041 A1 | | 11/2002 | Brown et al. |
| 2003/0026002 A1 | | 2/2003 | Lopez-Hernandez et al. |
| 2003/0039036 A1 | * | 2/2003 | Kruschwitz et al. .......... 359/707 |

OTHER PUBLICATIONS

International Search Report issued in International Application No. PCT/GB2010/001759 dated Dec. 28, 2010.

Written Opinion of the International Searching Authority issued in International Application No. PCT/GB2010/001759 dated Dec. 28, 2010.

British Search Report issued in British Application No. 0917132.3 dated Dec. 2, 2009.

* cited by examiner

LASER ILLUMINATOR

This invention relates to illumination systems. More particularly, it relates to illumination systems adapted to provide remote illumination over relatively large distances in support of camera or other observation systems, or of human observers.

Video cameras used for monitoring purposes often have long focal length lenses attached thereto, enabling them to provide useful images of objects located some distance away. In bright, daytime conditions it is relatively straightforward to provide a camera and lens arrangement that is capable of receiving sufficient light to generate good quality images. During night time conditions other techniques have been developed.

One such method is the use of image intensifier systems that act to amplify any light received such that it may be detectable by a camera system. Another common technique is to use a camera and lens system that is sensitive to thermal infra-red radiation. Infra-red radiation is generally given off by objects even in what would otherwise be thought of as complete darkness. This is due to the different physical temperatures and emissivities of different objects providing differing amounts of IR radiation from a scene.

Both of these methods are useful in many different scenarios. However they each have limitations to their effectiveness, especially at long ranges where it is required to resolve fine detail within the scene. The long focal length lenses required to provide sufficient magnification together with the physical constraints on their input aperture size result in much lower illumination levels on the systems' sensors than can be achieved when operating at short range.

For example, a typical image-intensified camera with a 40 degree field of view and relative aperture of F1 can provide a useable image at a scene illumination level of 0.001 lx, equivalent to clear starlight with no moon. A typical long range lens with a relative aperture of F10 requires 100 times as much light (i.e. 100 mlx) to produce the same quality image. This is equivalent to the illumination of a full moon.

Ambient night time illumination from the moon and stars is often therefore insufficient to produce the required image quality.

The use of detectors sensitive in the thermal Infra Red bands has other problems. The effect of diffraction at the wavelengths involved (typically 10 μm) restricts the resolution to a lower level than can be achieved in the visible or near infra red (NIR).

Furthermore, high resolution thermal sensors and their associated lenses are much more costly than their visible and NIR counterparts. The thermal imager is largely dependent on a temperature difference between a target and its background. For objects which do not generate any heat this thermal contrast may be very low indeed.

An additional problem for high sensitivity cameras of any type is their limited dynamic range, i.e. their limited ability to cope with a scene having a wide range of brightness levels, particularly where it is required to view image detail in the dark parts of the scene adjacent to very bright areas.

A solution to both the problems of insufficient ambient illumination and excessive contrast is to illuminate the area under observation. This has the effect of decreasing the dynamic range of the scene and, if sufficient illumination is provided, will mean that a standard visible or NIR camera may be used with much greater success. The level of additional illumination required will depend on the sensitivity of the image sensor. Since it generally desirable to supply as little illumination as possible it remains preferable to use a camera of high sensitivity.

An example of device which can illuminate a scene at long range from the position of the observer is the IZLID from www.bemeyers.com. This uses a high power laser source directed towards a focusing lens to generate a localised illumination region on a target of interest. The diameter of the lens is relatively small, which means that the light from the laser is concentrated in a relatively small area. Consequently such systems have difficulty passing current eye safety requirements should the target of interest be people, or if a person walks in the path of the illumination beam.

One solution to the problem is to increase the diameter of the lens, so that the light emitted by the illuminator is spread over a greater area. This reduces the optical power density (i.e. the power per unit area), and so will be safer should someone look into the beam. It has been found that it is difficult to provide a larger aperture in a compact device while still maintaining a relatively even illumination over the aperture. It has also been problematic to construct an illuminator that is able to produce an illuminated zone at varying ranges that has a relatively even illumination across the zone.

U.S. Pat. No. 6,431,731 discloses a laser device and method for producing a diffuse, divergent beam. A divergent beam so produced may be eye safe beyond a certain range, i.e. where the beam has diverged sufficiently to drop its power density below a safe threshold. At close ranges however, and in the extreme where a person adjacent the device looks straight into the beam, there is a significant risk that the average power density may be higher than safe limits.

It is an object of the present invention to produce an illuminator having improved eye safety that at least mitigates some of the disadvantages of the prior art.

According to the present invention there is provided a long range illuminator, the illuminator comprising a laser source having a laser power output, an optical feed and a primary optical element having an associated optical area, wherein the optical feed is arranged to transfer a light beam from the laser and provide it to the primary optical element to produce an illuminator output, characterised in that the optical feed comprises of a first optical fibre and a beam diverger, the diverger comprising at least a light diffuser, the diverger being arranged to generate, at an output of the optical feed, a cone of light to the primary optical element of a substantially uniform density across the optical area.

By incorporating a diverger in the optical feed the focal length of the illuminator, and hence the F-number, is reduced, facilitating a compact (in terms of length), eye-safe design. The position of the diverger, coming before the primary optical element, along with a suitable choice of laser power output and primary optical area, allows the illuminator to provide an output that is more uniform across the primary optical element, and hence reduces the chance of "hot spots" in the illumination at the output of the illuminator causing problems relating to eye safety. Variations in illumination intensity can make some regions of the illuminator output more intense than others, which may make an otherwise eye safe illuminator (at some given range) less eye safe.

It was found that, without the use of a diverger in the optical feed the cone of light produced at its output was relatively narrow and unsuitable for illuminating a large primary optical element without the illuminator becoming excessively long. A narrow beam illuminating a relatively close primary optical element, or a beam having its illumination concentrated centrally within the illumination cone is likely to result in the centre of the primary optical element being significantly brighter than the periphery. This can make it less eye-safe, particularly when the viewer is right next to the illuminator. By incorporating a beam diverger as disclosed herein the illumination spread across the primary optical element is made more uniform. Its incorporation may therefore, depending upon the absolute illumination levels and the area of the primary optical element, result in an illuminator being more eye safe than without it (e.g. by decreasing the viewing ocular hazard distance at which it is regarded as eye safe, or by making an otherwise non-eye safe illuminator eye safe at all viewing distances).

The solid angle of light output from an optical feed such as a fibre is defined by its numerical aperture (NA). The NA is described mathematically by NA=n·sin θ, where n is the refractive index of the medium through which the light is passing (usually of air in the embodiments described herein), and θ is the half angle of the cone of light emanating from the optical feed.

Advantageously the numerical aperture of the outputs of the optical feed, and the spacing between the output of the feed and the primary optical element is matched to the diameter of the primary optical element. Appropriate matching will ensure that the light emanating from the feed illuminates the full diameter of the at least one primary optical element, without excessive illumination beyond this. In this manner the full aperture of the at least one primary optical element is used. Supplementary lenses may also be used in addition to the diverger to tailor the illumination pattern from the optical feed to the primary optical element, to assist in illuminating the full aperture.

The diverger, helps to ensure that the light travelling in the optical feed fills the available angular space as defined by the NA in a uniform manner, so preventing "hot spots" in the beam at the exit aperture of the illuminator and improving the eye safety for a given optical output power. Preferably the illuminator is arranged to be eye safe at zero range, by ensuring that the illuminator power output divided by the optical area of the primary optical element, i.e. the illuminator output power density, is within eye safe limits.

The diverger may comprise one or more optical components inserted between a pair of fibres, or it may be located at an end of a single fibre. The diverger may comprise a plurality of optical components, one of which is a diffuser.

The diffuser may have one or more lenses on one or both sides thereof for coupling the light to and/or from the optical feeds(s).

The diffuser may be an "engineered diffuser" of the type produced by RPC Photonics or Rochester, N.Y., USA. This has the advantage of having more of a "top hat" profile when compared to a ground glass diffuser, which may result in lower light losses caused by overspill. These also provide an output angle of diffused light with varying input angles that is more uniform than a ground glass diffuser. A holographic diffuser may also provide similarly improved diffusion characteristics compared to a ground glass diffuser.

The optical feed advantageously comprises one or more optical fibres. These are simple to route through to different locations in the illuminator due to their generally flexible nature. The fibre is preferably highly multimode. The mix of modes in the fibre helps to provide a more even illumination at its output. The mode mixing improves as the light passes down the fibre, so making it advantageous to have enough length of fibre to provide a good mix. Multimode fibres are generally larger in diameter than single mode fibres. In embodiments where two fibres are used, with a beam diverger positioned between the two, the two fibres may have different diameters. The second fibre may have a larger diameter than the first.

The at least one primary optical element may be refractive, reflective, or diffractive.

Conveniently the at least one primary optical element is a curved, reflective surface. The curvature may conveniently be parabolic or spherical. A parabolic curvature may advantageously be employed if a higher quality illumination region is required, particularly at lower F-numbers, where the diameter of the reflective surface may be larger. The parabolic surface may be symmetric, or may alternatively be an off-axis parabola. A spherical curvature is generally easier, and hence cheaper, to manufacture, and may advantageously be employed if any resulting spherical aberration, which may lead to an uneven illumination profile, is tolerable.

Preferably, if a spherical mirror is employed then the reflective surface thereof is formed on a glass substrate. This is a relatively low cost option that is capable of producing very good quality optical elements. Alternatively, the primary optical element may be formed from a metal substrate by methods such as electroforming or diamond turning or by any other suitable means. A gold coated, diamond turned aluminium substrate, may conveniently be used to produce low cost non spherical mirrors. The quality of the at least one primary optical element has an effect upon the shape and other characteristics of the illuminated region, particularly when the illuminator has a low F-number and a narrow beam angle is required. For use at longer ranges where low beam divergence is more critical, and where a compact illuminator having a low F-number is desired, better quality optical elements are preferably used to achieve the desired illumination characteristics.

Alternatively the at least one primary optical element may comprise a refractive element. Typically this will comprise a convex lens having optical properties chosen according to the wavelength of operation, the illumination range required and the F-number required. The lens may be spherical or aspheric, depending upon the illumination characteristics desired.

Alternatively the at least one primary optical element may comprise a diffractive element, with a diffraction pattern chosen according to the desired properties of the illumination region, and the characteristics of the optical outputs from the lasers. The design requirements of a suitable diffraction pattern would be known to a normally skilled person in the art.

The laser may be modulated to effect a brightness control, or to impose an information content upon the illumination output, or for any other purpose. The illuminator may incorporate means for adjusting the distance between the output end of the optical fibre and the at least one primary optical element. In this manner a desired degree of de-focusing may be introduced, whereby the size of the illuminated zone on the area of interest may be varied. The focusing means may be arranged to have a minimum focusing distance. A mechanical or electronic interlock may be employed to prevent the illuminator focusing nearer than the minimum distance. By limiting minimum focusing distance additional eye-safety is provided. Without this the illuminator output may be brought to a focus so that the remote illuminating spot is smaller than the optical area of the primary optical element. This may lead to the power density at the focused remote illuminating spot being greater than eye-safe limits. If the focus is limited to a minimum distance where this cannot happen then the eye safety of the illuminator will not be degraded with distance. The focus may be limited to a minimum distance of infinity. This may be done by limiting the maximum distance from the output end of the optical fibre feed to that of the focal length of the primary optical element. Moving the output end closer to the primary optical element will create a divergent beam, and hence one that is more eye-safe with increasing distance. It will be understood that the range at which the illumination is focused is not the same as the range between the illuminator and the target. The focusing range merely gives control over the spot size on the target. The illuminator may therefore commonly be focused to a virtual point (or "beyond infinity") to provide an increased spot size on the target, wherever it may be located.

Figure 2:
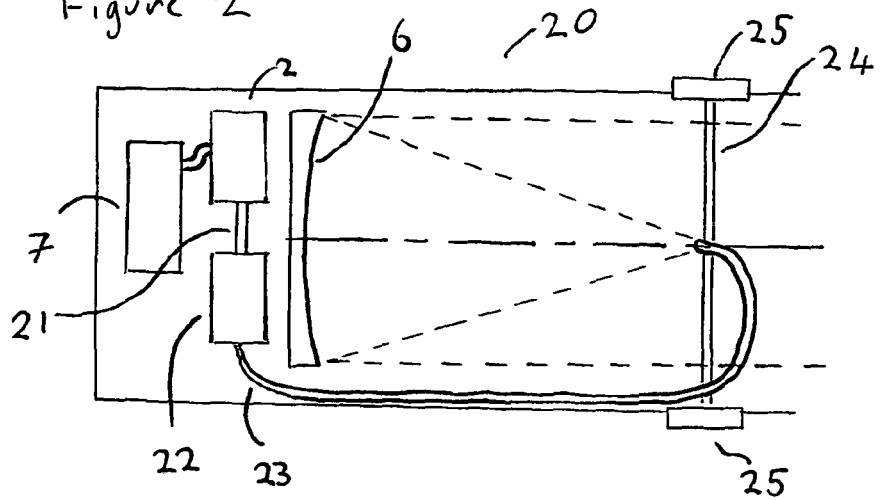
Figure 3:
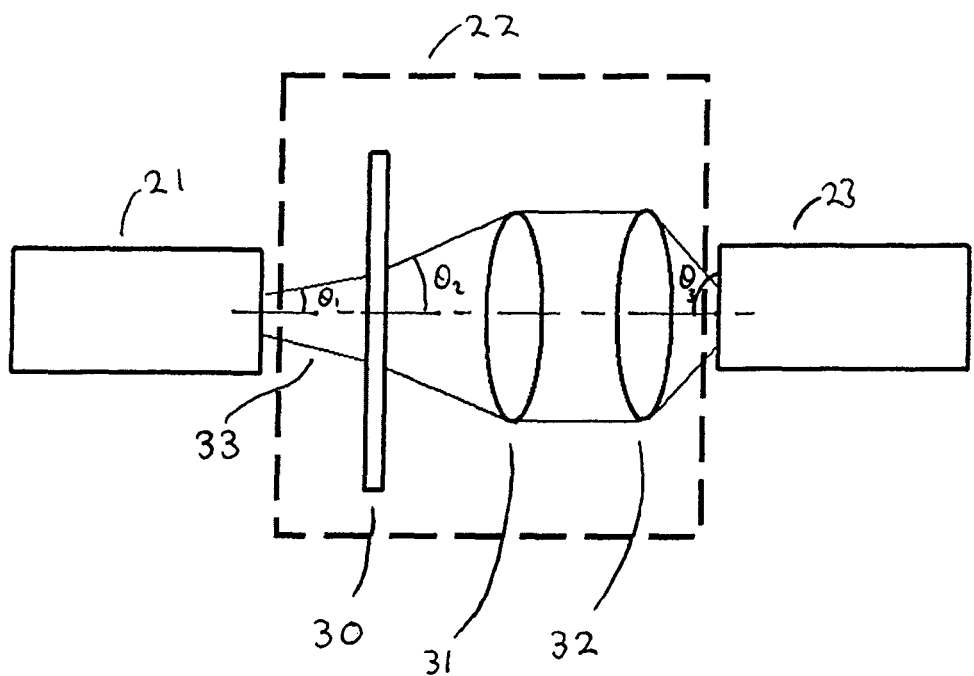

The invention will now be described, by way of example only, with reference to the following Figures, of which:

FIG. 1 diagrammatically illustrates a first embodiment of the present invention;

FIG. 2 diagrammatically illustrates a second embodiment of the present invention; and FIG. 3 diagrammatically illustrates a diverger suitable for use with the first or second embodiment.

FIG. 1 shows a first embodiment of the present invention. Illuminator 1 comprises laser module 2, beam diverger 3, optical fibre feed 4, supporting web 5, primary mirror 6, and power supply and control unit (PSCU) 7. These components are housed in a cylindrical housing 8.

A distal end 9 of the fibre feed 4 is supported by the web 5, such that the output of the fibre feed 4 is directed towards the primary mirror 6. The primary mirror 6 has a concave parabolic surface formed on a glass substrate and is gold coated to optimise the reflectivity at the wavelength of operation. Mirror 6 is moveable along the cylinder 8 to vary the distance between it and the distal end 9 of the fibre feed 3. Movement of mirror 6 thus provides a focusing action. A geared electric motor system 12, controlled by the PSCU 7 is used to move the mirror along the cylinder.

The laser module comprises an 845 nm laser diode operating at a nominal 2 W. Adjacent the laser module 2 the PSCU 7 provides power to the laser module 2, and to the focusing motor 12. It receives its power from an external power source (not shown). The PSCU 7 is also able to shutdown the laser module if responses from sensors indicate that there may be a safety issue. These sensors may be arranged to sense over and under-temperature of the laser module, excessive power from the laser, disconnection from network remote controller and focusing out of range.

In use, power is switched on to the system, activating the laser 2. Light 10 from the laser enters diverger 3 that contains a glass diffuser, to produce a more angularly diffuse beam of light. This is then collected and focused, by a pair of lenses, onto the input of an optical fibre acting as the optical feed 4. The light is emitted from the end of the fibre 4, in a cone shape dictated by the NA of the fibre and the characteristics of the diverger 3, to illuminate the mirror 6. The mirror 6 reflects this light 11 (this being the illuminator output) along its optical axis out to a target. A control signal, sent from a user control panel (not shown), and received by PCSU 7 may be used to initiate movement of the mirror 6 in order to adjust the focus of the beam 11 to change the illumination spot size on the target.

It was found that the light from different laser modules varied considerably in terms of its solid angle of projection. This made it difficult to use a lens based technique for increasing the divergence angle of the light output from the laser, as the optics associated with a purely lens based diverger would then have to be tuned for each separate laser module. This would increase the unit cost and also complicate repairs and maintenance.

The average or instantaneous output power of the laser may be controlled so as to implement a brightness control, or to modulate the illumination. This may be done by any suitable means. For example, the current controlling the laser may be pulsed at an appropriate pulse repetition rate and duty cycle, with the duty cycle being variable according to the desired average brightness. The repetition rate may conveniently be synchronised with a line rate of an associated camera sensor, to reduce switching interference associated with the power cycling of the laser. Alternatively, the brightness may be controlled by reducing the steady state current to the laser.

The primary mirror 6 is a gold coated, diamond turned aluminium parabolic mirror, although a spherical mirror may also be used. The normally skilled person will be aware of the design constraints and optical limitations of a given mirror profile, this being a well understood field of optics. The gold coating is particularly reflective at the wavelength of interest, 845 nm. The diameter of the mirror 6 in this embodiment is 200 mm, and the distance between the mirror 6 and the focal point is 260 mm. The relative aperture or F number is therefore 1.3, this value being approximately matched to the divergence of the light output from the fibre so that the cone of light from the fibre fills the full diameter of the element 5. The choice of a low F number enables the device to be made very compact and light, which is convenient both for mechanical mounting and for ease of directing the illuminator.

FIG. 2 shows a second embodiment 20 of the present invention. This is generally similar to the first embodiment, except for aspects of the optical feed and its relation to the diverger, and the focusing mechanism. Only these differing aspects will be discussed. Laser module 2 provides a laser output to a first optical fibre 21. This in turn is optically connected to diverger 22, which is connected to a second optical fibre 23. The diverger 22 works in similar fashion to that of the first embodiment except that it is adapted to be coupled to optical fibres at both its input and output. This provides more versatility in terms of where the diverger may be located. Web 24 supports the distal end of second optical fibre 23 so as to maintain correct orientation of the fibre 23 with the mirror 6. A geared electric motor 25, controlled by PSCU 7, is arranged to control the position of the web 24, and hence also the position of the output of fibre 23 in relation to mirror 6, to provide a focusing action. The web 24 with attached fibre 23 will in general be lighter than mirror 6, and so it will often be more convenient to move this to implement a focusing action rather than the mirror. This embodiment is adapted to provide around 6 mm of movement of the web 24 to effect the focusing action. This provides a light cone of half angle of between 2.5 and 12 milliradians.

FIG. 3 shows in more detail the diverger 22 of FIG. 2. It comprises a diffuser element 30 and a pair of coupling lenses 31, 32. Light 33 enters the diffuser 22 from fibre 21 in a cone of half-angle $\theta_1$, determined by the NA of the first fibre 21 and the output beam from the laser feeding first fibre 21. This can vary significantly between different laser units of the same type, and so is relatively unpredictable. The light then passes through diffuser element 30. This is an "engineered diffuser" from RPC Photonics as discussed above. It has been found that these produce a more consistent output in terms of their diffusion characteristics (i.e. half angle $\theta_2$) with varying input characteristics, and hence provide a lower loss of light and a more even final illumination of mirror 6. Lenses 31 and 32 receive light from the diffuser and focus it on an input of second fibre 23. Light enters fibre 23 at half solid angle $\theta_3$ that is less variable than entry angle $\theta_1$. This light travels down second fibre 23 and emerges to illuminate mirror 6 at the same half solid angle $\theta_3$. In this embodiment $\theta_3 = \theta_2$, although this need not be the case with other optical arrangements.

Note that the diverger 22 is the same as diverger 3 in FIG. 1 with the exception of the input feed being adapted to receive light from a fibre rather than a laser directly. The principle of operation is therefore identical.

The diverger embodiment described in relation to FIG. 3 is designed to feed a second optical feed (fibre 23). The lenses 31, 32 are chosen so as to bring the light from diffuser 22 to a focus in the vicinity of the input of fibre 23, so as to collect a significant amount of the light in the fibre. The light entering fibre 23 is a cone of half angle greater than that of the light emanating from fibre 21. The focal lengths of lenses 31, 32, and their relative spacings are therefore chosen as appropriate to focus the light as described. A suitable choice for the lenses' focal lengths and spacings would be made by the normally skilled person to achieve the objective of taking light from a first fibre (or the laser itself) and providing it as an input to the second fibre.

There is a degree of light loss through the diverger, typically in the order of 1-2 dB. This loss can be compensated if necessary by specifying the laser optical output power a similar amount higher.

The optics of the diverger may be arranged in any suitable manner. For example, the diffuser element may be located between a pair of lenses, the lenses being used to couple light from the laser or a first fibre to a second fibre. Alternatively the diverger may comprise of a diffuser (such as an engineered diffuser or holographic element) placed at an output of the optical feed, between it and the primary optical element. This is a particularly simple embodiment, but has a disadvantage that the diffuser may partially block light from being emitted from the illuminator.

The invention as described herein has particular utility in providing illumination for camera systems at medium to long ranges. The range of use will vary according to characteristics of a particular embodiment, but the invention may typically be used over ranges from 30 m such as from 60 m such as from 100 m such as from 150 m, and may typically be used at ranges up to 20 km, such as up to 5 km, such as up to 2 km, such as up to 500 m. The practical range will be dependent upon the aperture size of the illuminator, the illumination power employed, and the stability of the mounting means used. Of course it may be used at ranges outside of those stated, but with diminishing capability (at the longer ranges).

An illuminator according to the invention may be mounted on a pan and tilt unit, or other similar mounting means, allowing it to be pointed in a range of directions. The pan and tilt head may advantageously be powered, and controllable remotely. The pan and tilt head may advantageously also support an associated camera system, such that both the camera and the illuminator move together. In this way, a consistent alignment between the illuminator and an associated camera system can be assured.

The present invention may advantageously be used alongside camera systems able to operate a range-gating system. The illuminator may be modulated such that it generates short illumination pulses, of the order 30-100 ns, and the associated camera system's sensor gated to receive the pulse at a predetermined time, and for a predetermined duration, after its transmission. By selecting these times light from the illuminator reflected from targets only at a given range band will enter the camera, the range corresponding to the propagation delay of the illumination light from the illuminator to the target and back.

Note that in this specification the terms "illuminator", "illumination" and their derivatives should not be limited in scope to mean that they only relate to visible light. It will be apparent to the normally skilled person that the illumination may be visible, ultra violet, or near infra-red or any combination of these. The invention may be used to produce an illuminator that is eye safe at all ranges, or it may be used to produce illuminators that are eye safe only beyond a given range. The use of a diverger as disclosed herein however may allow the minimum range at which an illuminator is deemed to be eye safe to be reduced. Thus references to improved eye safety in this specification should be taken to mean an improvement over an otherwise similar illuminator not having a diverger.

The above examples have been disclosed for illustrative purposes, and those skilled in the art will appreciate that various modifications, additions and substitutions are possible, without departing from the scope of the invention as disclosed in the accompanying claims.

The invention claimed is:

1. A long range illuminator comprising:
a laser source having a laser power output, an optical feed and a primary optical element having an associated optical area, wherein the optical feed is arranged to transfer a light beam from the laser and provide it to the primary optical element to produce an illuminator output, wherein:
the optical feed includes a first optical fibre and a beam diverger, the beam diverger including at least a light diffuser, the beam diverger being arranged to generate, at an output of the optical feed, a cone of light to the primary optical element of a substantially uniform density across the optical area,
the beam diverger is coupled to the first optical fibre such that light from the beam diverger passes into the first optical fibre, the first optical fibre being arranged to provide light to the primary optical element, and
the first optical fibre is a multimode fiber selected to encourage mixing of modes within the fibre as light from the beam diverger passes down the first optical fibre,
wherein the primary optical element comprises a reflecting element, and is arranged to provide illumination to a range of at least 30 meter.

2. An illuminator as claimed in claim 1 wherein the laser power output and the optical area of the primary optical element are chosen such that the illuminator output power divided by the optical area is within eye safe limits.

3. An illuminator as claimed in claim 1 wherein the light diffuser comprises an engineered diffuser itself comprising an array of microstructured elements arranged to produce a uniform light intensity across an output beam.

4. An illuminator as claimed in claim 1 wherein the beam diverger is arranged to receive light from a second optical fibre, and to provide light to the first optical fibre.

5. An illuminator as claimed in claim 4 wherein a pair of coupling lenses are arranged to couple light between an output of the second optical fibre and an input of the first optical fibre, the light also passing through the diffuser.

6. An illuminator as claimed in claim 4 wherein the engineered diffuser receives light from the second optical fibre and provides light to at least one coupling lens.

7. An illuminator as claimed in claim 1 wherein the at least one primary optical element is a parabolic mirror.

8. An illuminator as claimed in claim 1 wherein the at least one primary optical element is a spherical mirror.

9. An illuminator as claimed in claim 1 wherein the illuminator additionally comprises a focuser adapted to change a size of an illuminated zone on a target of interest.

10. An illuminator as claimed in claim 9 wherein the focuser is adapted to change a relative distance between the primary optical element and a distal end of the optical feed.

11. An illuminator as claimed in claim 9 wherein the focuser additionally comprises an interlock preventing the illuminator output beam from being focused nearer than some predetermined minimum distance.

12. An illuminator as claimed in claim 1 wherein a modulator is included that is arranged to modulate the optical power of the illuminator output.

13. An illuminator as claimed in claim 1 wherein the numerical aperture of the first optical fibre is matched to the diameter of the primary optical element.

14. A long range illuminator, the illuminator comprising:
a laser source having a laser power output, an optical feed and a primary optical element having an associated optical area, wherein the optical feed is arranged to transfer a light beam from the laser and provide it to the primary optical element to produce an illuminator output, wherein:
the optical feed includes a first optical fibre and a beam diverger, the beam diverger including at least a light diffuser, the beam diverger being arranged to generate, at an output of the optical feed, a cone of light to the primary optical element of a substantially uniform density across the optical area,
the beam diverger is coupled to the first optical fibre such that light from the beam diverger passes into the first optical fibre, the first optical fibre being arranged to provide light to the primary optical element, wherein the first optical fibre is a single optical fibre, and
the primary optical element comprises a reflecting element, and is arranged to provide illumination to a range of at least 30 meters.

15. A long range illuminator, the illuminator comprising:
a laser source having a laser power output, an optical feed and a primary optical element having an associated optical area, wherein the optical feed is arranged to transfer a light beam from the laser and provide it to the primary optical element to produce an illuminator output, wherein:
the optical feed includes a first optical fibre and a beam diverger, the beam diverger including at least a light diffuser, the beam diverger being arranged to generate, at an output of the optical feed, a cone of light to the primary optical element of a substantially uniform density across the optical area,
the beam diverger is coupled to the first optical fibre such that light from the beam diverger passes into the first optical fibre, the first optical fibre being arranged to provide light to the primary optical element, and
the first optical fibre is a multimode fibre selected to encourage mixing of modes within the fibre as light from the beam diverger passes down the first optical fibre,
wherein the primary optical element is a reflecting element, and is arranged to provide illumination to a range of at least 30 meters, and
the illuminator further incorporates a focuser for focusing the output beam, wherein the focuser is limited to having a minimum focus distance of infinity.

\* \* \* \* \*